(12) United States Patent
Wang et al.

(10) Patent No.: US 7,756,236 B2
(45) Date of Patent: Jul. 13, 2010

(54) PHASE DETECTOR

(75) Inventors: Jinn-Shyan Wang, Min-Hsiung (TW);
Yi-Ming Wang, Min-Hsiung (TW)

(73) Assignee: National Chung Cheng University,
Chia-Yi County (TW)

( * ) Notice: Subject to any disclaimer, the term of this patent is extended or adjusted under 35 U.S.C. 154(b) by 649 days.

(21) Appl. No.: 11/757,833

(22) Filed: Jun. 4, 2007

(65) Prior Publication Data

US 2007/0223637 A1    Sep. 27, 2007

(30) Foreign Application Priority Data

Sep. 27, 2006    (TW) .............................. 95135788 A

(51) Int. Cl.
*H03D 3/24* (2006.01)
*H03D 13/00* (2006.01)

(52) U.S. Cl. ....................................... 375/375; 327/236

(58) Field of Classification Search ................. 375/327, 375/328, 375, 376; 327/156, 236, 244
See application file for complete search history.

(56) References Cited

U.S. PATENT DOCUMENTS

| | | | |
|---|---|---|---|
| 6,754,841 B2 * | 6/2004 | Yang | 713/503 |
| 6,931,086 B2 * | 8/2005 | Harrison | 375/374 |
| 2008/0061838 A1 * | 3/2008 | Wang et al. | 327/3 |

* cited by examiner

*Primary Examiner*—Young T. Tse
(74) *Attorney, Agent, or Firm*—Birch, Stewart, Kolasch & Birch, LLP

(57) ABSTRACT

A phase detector is described, comprising a pair of output-latched half-transparent (OLHT) module each receiving two input terminals with an inverse connection relationship with respect to two input signals as compared to each other, wherein each OLHT module of the pair comprises two stages of logic operation unit connected in series and a latch circuit electrically connected to a latter one of the two stages of logic operation unit and latching and output an output signal.

16 Claims, 9 Drawing Sheets

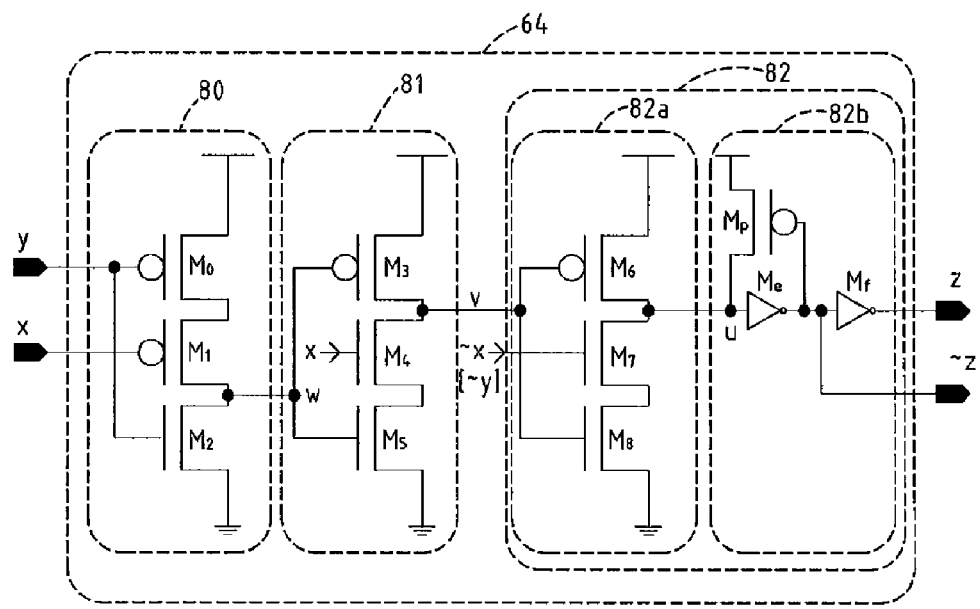
FIG. 8a
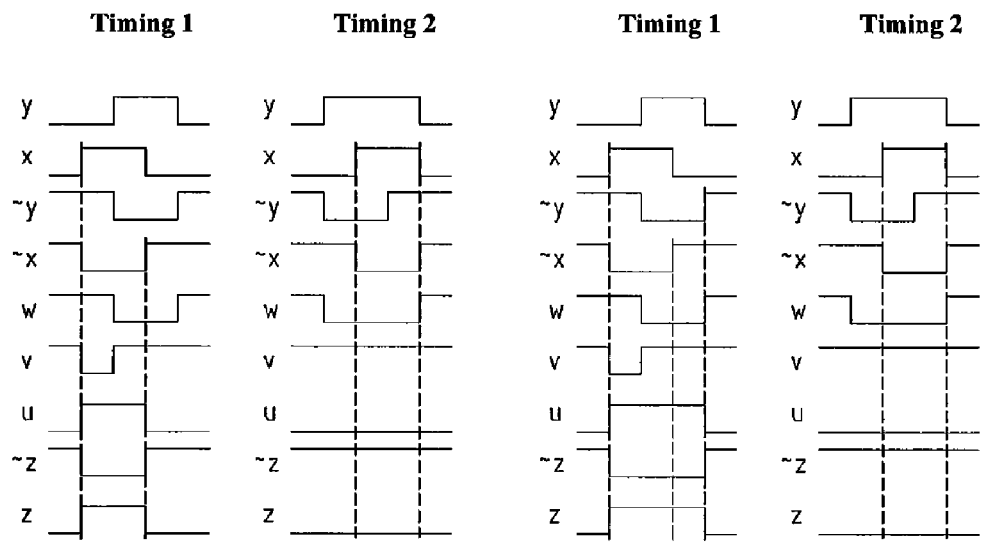
FIG. 8b          FIG. 8c

PHASE DETECTOR

BACKGROUND OF THE INVENTION

1. Field of the Invention

The present invention relates to a phase detector and particularly to a phase detector having a half-transparent module with an output-latched characteristic.

2. The Prior Arts

Phase detector is an important building block of many de-skewing circuits, such as the delay-locked loop (abbreviated as DLL), the phase locked loop (PLL) and the clock/data recovery circuit. The smallest detectable phase difference of the phase detector has a linear relationship with the phase resolution of de-skewing circuits. The smaller the detectable phase difference of the phase detector (or the smaller the dead zone) is, the higher the phase resolution. Moreover, the operating speed of the phase detector can affect the maximum operating frequency of the de-skewing circuits. In these regards, the most important design requirements of the phase detector are high speed and high resolution.

Referring to FIG. 1a and FIG. 1b, a high speed and high resolution phase detector in the prior art and the circuit of a half-transparent (HT) module of the phase detector are depicted, respectively. As shown in FIG. 1a, the phase detector 1 receives input signals CK_ref and CK_fb. The half-transparent module 12 is formed with two cascaded logic operation units 10, 11 as shown in FIG. 1b. The logic operation unit 10 is formed with two PMOS transistors M0 and M1 and one NMOS transistor M2. Both MOS transistors M0 and M2 receive a first input signal y, and the MOS transistor M1 receives a second input signal x.

The logic operation unit 11 is formed with one PMOS transistor M3 and two cascaded NMOS transistors M4 and M5. Both MOS transistors M3 and M5 receive an output signal w from the logic operation unit 10, and the MOS transistor M4 receives the control signal x. The output of the logic operation unit 11 is also the output signal ~z of the half-transparent module 12.

Referring to FIG. 1c, two sets of timing, Timing 1 and Timing 2, of the half-transparent module shown in FIG. 1b are shown, respectively. In timing 1, a rising edge of the first input signal y has a phase lag with respect to that of the second input signal x. In Timing 2, a rising edge of the first input signal y has a phase lead with respect to that of the second input signal x. Taking the operation of Timing 1 as an example, when the first and second input signals y, x are both low (i.e. y=0 and x=0), the transistors M0 and M1 are both turned on. At this time, the output signal w of the logic operation unit 10 rises to high, turning off PMOS transistor M3 and turning on NMOS transistor M5. At this time, since the second input signal x is low, NMOS transistor M4 in the logic operation unit 11 is also turned off, keeping the output signal ~z of the half-transparent module 12 at the previous state thereof (e.g. high state).

When the second input signal x begins to transit to high, transistor M1 of the logic operation unit 10 is turned off, and transistor M4 of the logic operation unit 11 is turned on to pull down the output signal ~z of the half-transparent module 12. The output signal ~z keeps stay low until the first input signal y transits to high. This is because that the output signal w of the logic operation unit 10 will transit to low as the first input signal y becomes high, turning on the PMOS transistor M3 and thus turning off the NMOS transistor M5 of the second logic operation unit 11. At this time, the output signal ~z of the half-transparent module 12 is pulled high.

In summary, when the rising edge of the first input signal y has a phase lag with respect to the second input signal x, the output signal ~z has the time when it stays low being equal to a phase difference of the first and second input signals y and x.

Similarly, we can deduce from Timing 2 that if the rising edge of the first input signal y leads that of the second input signal x, the output signal ~z of the half-transparent module 12 maintains high owing to absence of a discharging path.

In conclusion, when the condition is met where the first input signal y has its rising edge lagging that of the second input signal x, the half-transparent module 12 will output a low pulse output having a pulse width equal to the phase difference of the two input signals x and y.

To detect the phase relationship of the input signals x and y, two identical half-transparent modules 12 of this kind are required to form the phase detector 1, shown in FIG. 1a, where input signals y and x for the upper and lower ones of the two identical half-transparent modules 12 are inversely connected.

From the above explanation, we know that the pulse width of the output signal ~z becomes shorter as the rising edges of the two input signals y and x get closer to each other (i.e. the phase difference is smaller). To guarantee that the narrow pulse of the half-transparent module 12 can properly drive the subsequent circuit, it is required that the loading of the half-transparent module 12 is not too large; otherwise, the narrow pulse will be filtered out, making the subsequent circuit work improperly. Accordingly, this kind of phase detector 1 is generally applied to a charge pump-based loop configuration in which the phase detector only need to drive the charge pump. However, a phase detector used in a digital control loop has to drive a counter or a shift register composed of several flip-flops resulting in heavy loading. Thus, from the requirement of a small phase error, it is not appropriate to apply the above described phase detector 1 in the digital control loop.

To solve this problem, there was a flip-flop based phase detector suggested as a solution to the application of a digital control loop.

FIG. 2a is the diagram of the flip-flop based phase detector in the prior art. The flip-flop based phase detector 2 is composed of three buffers 20, 21, 22, two D-type flip-flops 23, 24, and two NOR gates 25, 26. Each of the flip-flops 23, 24 has a clock input terminal connected to the buffer 21 having a delay of d0 and connected to the buffer 22 having a delay of d1, respectively. The amount of the two delays are set different (d1>d0) to allow the flip-flops 23, 24 to grasp the same input signal A, which is the output of the buffer 20, at different points of time. The output signals D, E and F of flip-flops 23, 24 are operated with the NOR gates 25, 26 to generate output signals UP/~DOWN and LOCK of the flip-flop based phase detector 2 to determine the phase relationship, i.e., phase lag, phase lead, or phase lock, between the two input signals CK_ref and CK_fb.

FIG. 2b is the plot of three sets of timing, Timing 1, Timing 2 and Timing 3, occurring on the flip-flop based phase detector 2 shown in FIG. 2a. Refer to Timing 1 in FIG. 2b, if the values of signal A at two time points when signal B and signal C rise are high, it can be judged that the input signal CK_ref has a phase lead with respect to the input signal CK_fb. In this case, after detecting the phase relationship, the output signal UP/~DOWN transits to low and the output signal LOCK maintains at low level. Refer to Timing 2 in FIG. 2b, if the values of signal A at two time points when signal B and signal C rise are low, it can be judged that the input signal CK_ref has a phase lag with respect to the input signal CK_fb. In this case, the output signal UP/~DOWN maintains at high level while the output signal LOCK maintains at low level. Refer to Timing 3 in FIG. 2b, if the signal A is low and high, respectively, when the signals B and C rise, it is judged that the input signals CK_ref and CK2_fb lock with each other. In this case, the output signal UP/~DOWN transits to low level and the output signal LOCK transits to high level.

From above descriptions, we know that the two output signals UP/~DOWN and LOCK are generated through the logic operation on the latched output signals of flip-flops 23 or 24. Therefore, UP/~DOWN and LOCK are stable logic signals, but not pulsed signals. Accordingly, such kind of phase detector 2 can be used in a digital control loop.

The flip-flop based phase detector 2 has a dead zone approximately equal to the time difference between the signals B and C. In the prior art, the dead zone is designed as small as 160 ps. To reduce the dead zone, the buffer 22 generating the signal C should be sized up to shorten the time d1. However, the up sized buffer 22 will increase the loading of the clock signal CK_fb. Therefore, such a design not only induces higher power consumption but also enlarges the loading difference between the signals CK_ref and CK_fb.

Referring next to FIG. 3a, in which another flip-flop based phase detector in the prior art is depicted. This kind of phase detector 3 is composed of two buffers 30 and 31, three D-type flip-flops 32, 33, 34, XOR logic gates 35, 36 and an OR logic gate 37. In the phase detector 3, the buffer 30 has a delay d and is connected to a clock input terminal of the flip-flop 33, and the buffer 31 also has a delay d and is connected to a data input terminal of the flip-flop 34. The buffers 30 and 31 are used to provide a delay to the input signals CK_fb and CK_ref, respectively. The flip-flop 32 generates an output signal UP/~DOWN. The flip-flops 33 and 34 generate output signals C and D, respectively, and these signals are subsequently sent to the XOR gates 35, 36 and OR gate 37 to generate another output signal LOCK. Similarly, the output signals UP/~DOWN and LOCK are used to determine whether a phase lead, phase lag or phase lock exists between the input signals CK_ref and CK_fb.

FIG. 3b is a plot of three sets of timing, Timing 1, Timing 2 and Timing 3, of the flip-flop based phase detector shown in FIG. 3a, With respect to Timing 1, if both the signals CK_ref and B are high when the signal CK_fb rises and if the signal CK_ref is high when the signal A rises, it can be judged that the input signal CK_ref has a phase lead with respect to the input signal CK_fb. In this case, the output signal UP/~DOWN transits to high while the output signal LOCK transits to high for a duration of d and then transits to low again. Similarly, if both the signals CK_ref and B are low when the signal CK_fb rises and the signal CK_ref is low when the signal A rises, it can be judged that the input signal CK_ref has a phase lag with respect to the input signal CK_fb. In this case, both the output signals UP/~DOWN and LOCK are maintained at low level. In the other respect, if the signal CK_ref is high and the signal B is low when the signal CK_fb rises and if the signal CK_ref is high when the signal A rises, it can be judged that the input signals CK_ref and CK_fb lock with each other. In this case, both the output signals UP/~DOWN and LOCK transit to high level.

It can be seen that the two output signals UP/~DOWN and LOCK of the flip-flop based phase detector 3 are generated from stable outputs provided by flip-flops 32, 33 or 34. Accordingly, such kind of phase detector 3 may be used in a digital control loop.

In this kind of phase detector 3, the dead zone is approximately equal to the delay time d provided by buffer 30. To reduce the dead zone, we can up size buffer 30 to reduce the delay d. However, the up sized buffer 30 will increase the loading of the clock signal CK_fb and the power consumption contributed by buffer 30 itself. Therefore, such a design not only induces higher power consumption but also enlarges the loading difference between the signals CK_ref and CK_fb.

FIG. 4 is yet another flip-flop based phase detector in the prior art. The phase detector 4 is composed of two buffers 40 and 41, three D-type flip-flops 42, 43 and 44, a three-input AND gate 47, two two-input AND gates 45, 46, and a two-input OR gate 48. The phase detector 4 receives two input signals CK_ref and CK_fb and generates two output signals UP and DOWN.

In this kind of phase detector 4, the dead zone is approximately equal to the delay time d of the input buffer 40. To reduce the dead zone, we can up size buffer 40. However, the up sized buffer 40 will increase the loading of the clock signal CK_ref and the power consumption contributed by buffer 40 itself. Therefore, such a design not only induces higher power consumption but also enlarges the loading difference between the signals CK_ref and CK_fb.

In summary, the flip-flop based phase detectors used in the prior art have the following disadvantages: (1) The dead zone is determined by the delay time of buffers. The delay time can not be reduced to a very small value. Large dead zones often induce high jitter for the control loop. (2) In case that the flip-flops have a too large setup time or a too large hold time, the dead zone is broadened further. (3) The two input clock signals are sampled by different flip-flops. If the characteristics of the flip-flops, say the setup time and the hold time, are different, the dead zones for phase lead and phase lag will be asymmetric. (4) The phase detector is so complicated that the circuit requires a larger chip area. (5) The phase detector is also complicated to induce high power consumption.

Referring next to FIG. 5, in which a dynamic circuit based phase detector in the prior art is depicted. The dynamic circuit based phase detector 5 is composed of two dynamic circuit modules 50 and 51 and two RS latches 52 and 53. Each RS latch is composed of two cross-coupled NOR gates. The dynamic circuit module 50 is composed of one PMOS transistor M0 and two NMOS transistors M1 and M2 connected in series. Both transistors M0 and M2 receive a precharge input signal CK_precharge, while transistor M1 receives an input signal CK_ref. The dynamic circuit module 51 is composed of one PMOS transistor M3 and two NMOS transistors M4 and M5 connected in series. The dynamic circuit module 51 has totally the same connection relationship with the dynamic circuit module 50, however with the transistor M4 connected to CK_fb. The RS latch 52 is provided to latch the output signals A and B of the dynamic circuit modules 50 and 51, and the RS latch 53 is provided to latch the output signals of the RS latch 52.

In this kind of phase detector 5, the dynamic circuit modules 50 and 51 are used to replace the flip-flops in the flip-flop-based phase detector and thus the complexity of the circuit is reduced. Furthermore, due to the inherent characteristic of high speed with the dynamic circuit, the dead zone is reduced. As a result, it has been proved that the phase detector 5 can be operated under the frequency of 1 GHz and have a dead zone smaller than 10 ps. However, the precharge signal CK_precharge is required to precharge the dynamic circuit modules 50 and 51 and the timing for CK_precharge should be carefully controlled. However, from the system point of view, it is difficult to generate a special precharge signal CK_precharge with a precise timing control. This effect retards the effectiveness of this kind of phase detector in the real applications.

SUMMARY OF THE INVENTION

To overcome the difficulties and problems encountered in the prior art, the present invention relates to a phase detector, particularly having a dynamic circuit therein, operated under a relatively higher frequency and capable of detecting a very small phase difference.

In accordance with the present invention, the phase detector comprises a first output-latched half-transparent (OLHT) module and a second OLHT module, the first output-latched half-transparent (OLHT) module having a first input terminal receiving a first input signal and a second input terminal receiving a second input signal; and the second OLHT module having a first input terminal receiving the second input signal and a second input terminal receiving the first input signal; wherein each of the first and the second OLHT modules further comprises a first logic operation unit, a second logic operation unit and a latch circuit, the first logic operation unit receiving the first and the second input signals and outputting a first stage output signal in response thereto, the second logic operation unit electrically coupled to the first logic operation unit and receiving the second input signal and the first stage output signal to output a second stage output signal in response to the first stage output signal and the second input signal, and the latch circuit electrically connected to the second logic operation unit and receiving the second input signal, the second stage output signal and a logic low signal to latch a third stage output signal.

Other features and advantages will become apparent after the description below with reference to the annexed drawings is read.

The annexed drawings are provided herein for further understanding of the present invention, constitute a part of the present invention for explanation of the embodiment(s) of the present invention and serve, together with the detailed description, to explain the principle of the present invention.

BRIEF DESCRIPTION OF THE DRAWINGS

FIG. 1b is a circuit diagram of a half-transparent module included in the phase detector shown in FIG. 1a;

FIG. 2b is a timing plot of three sets of timing of the phase detector shown in FIG. 2a;

FIG. 8a is a schematic diagram of the OLHT module of the phase detector according to a third embodiment of the present invention;

FIG. 8b is a timing plot of the OLHT module of the phase detector as shown in FIG. 8a according to the third embodiment of the present invention;

FIG. 8c is a timing plot of two sets of timing occurring when a MOS transistor M7 is controlled by an output signal ~y;

DETAILED DESCRIPTION OF THE PREFERRED EMBODIMENTS

Figure 1A:
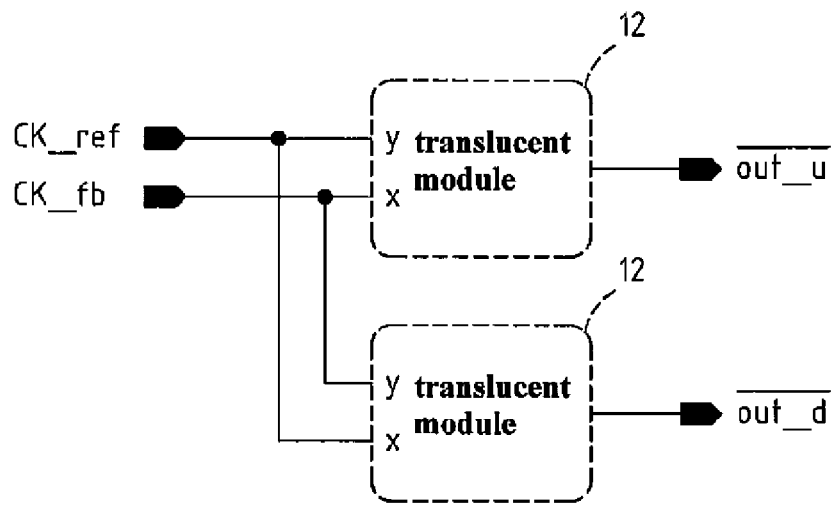
FIG. 1a is a high speed and high resolution phase detector in the prior art.
Figure 1B:
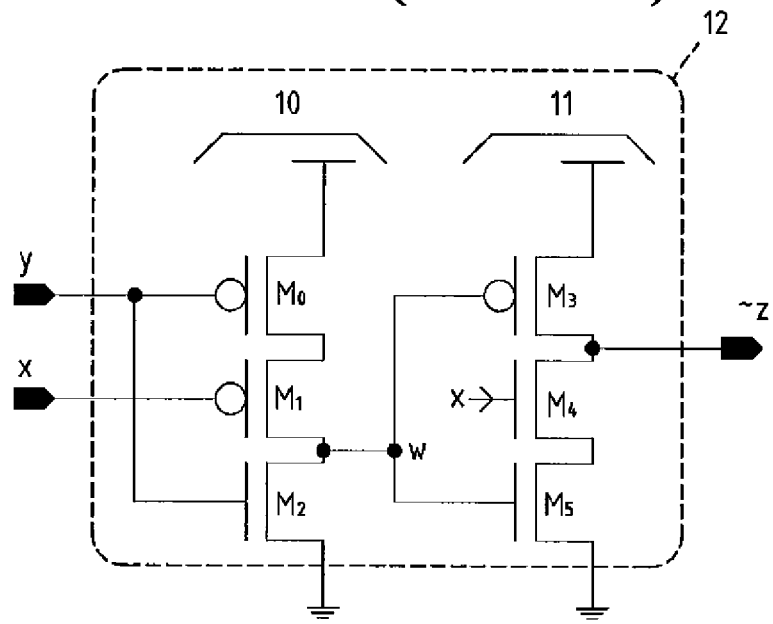
Figure 1C:
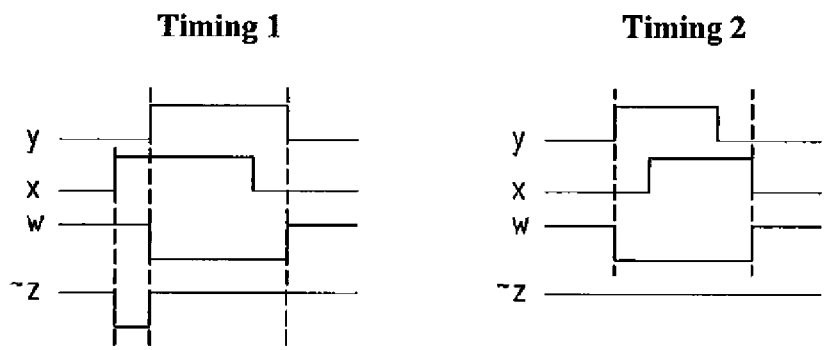
FIG. 1c is a timing plot of two sets of timing applied on the half-transparent module shown in FIG. 1b.
Figure 2A:
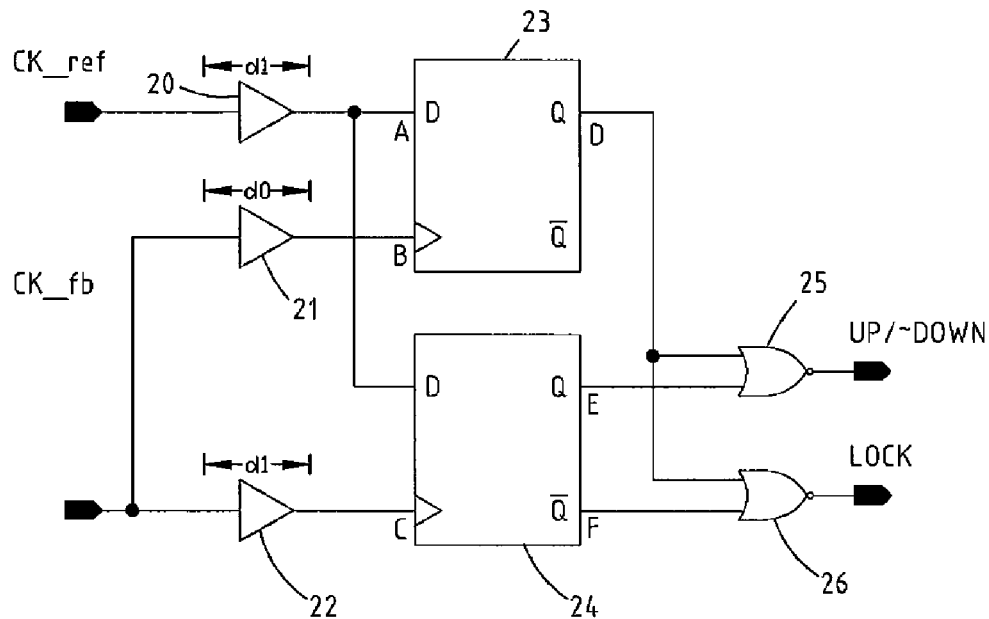
FIG. 2a is a flip-flop based phase detector in the prior art.
Figure 2B:
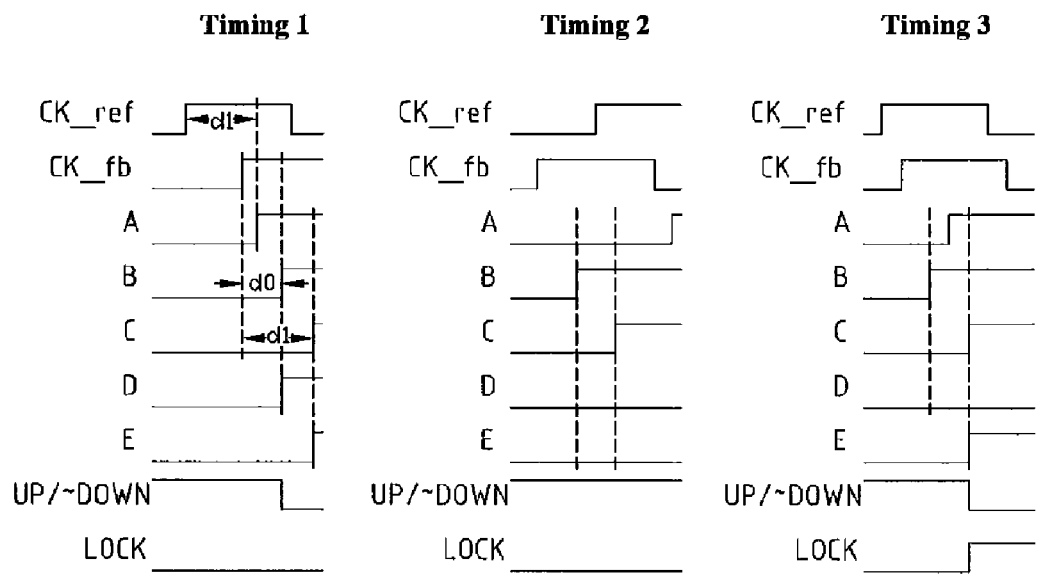
Figure 3A:
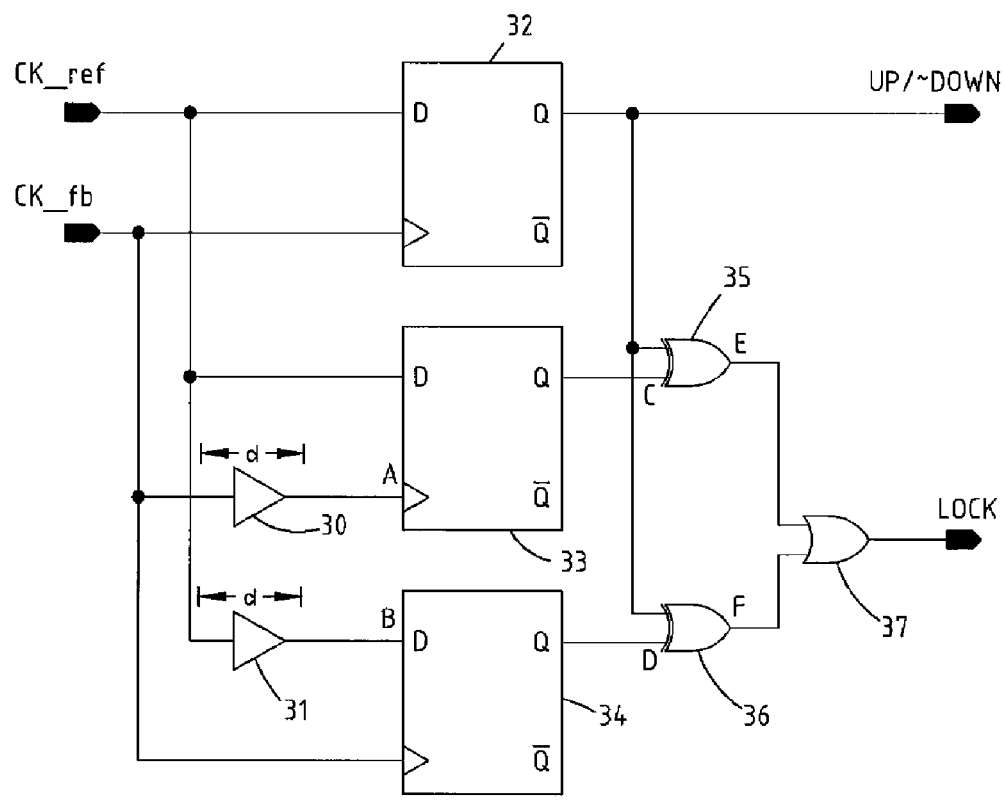
FIG. 3a is another flip-flop based phase detector in the prior art.
Figure 3B:
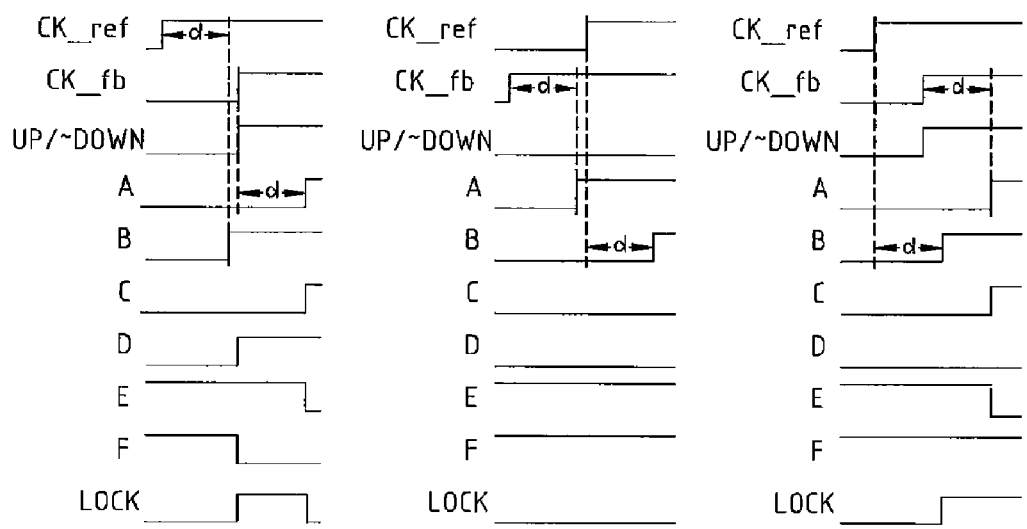
FIG. 3b is a timing plot of three sets of timing of the phase detector shown in FIG. 3b.
Figure 4:
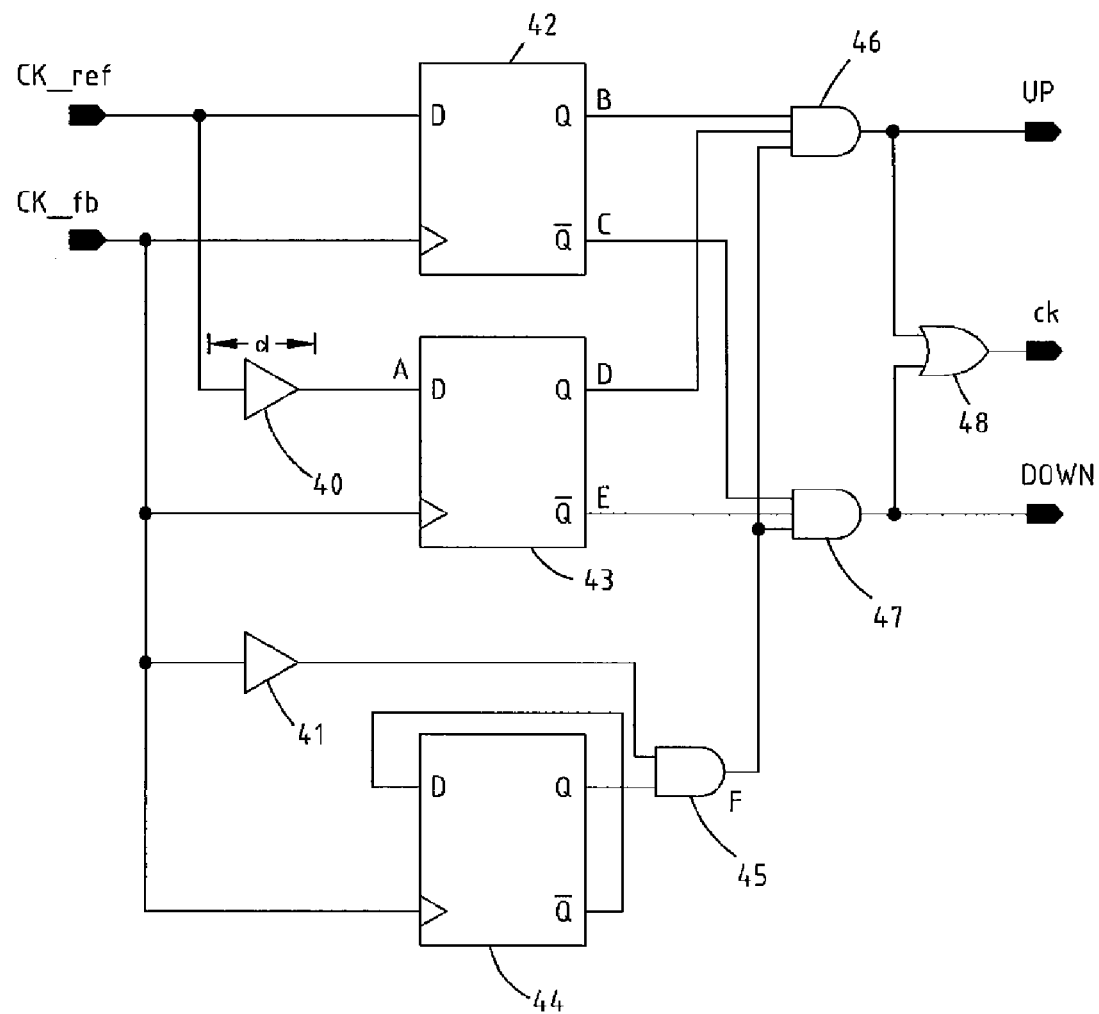
FIG. 4 is yet another flip-flop based phase detector in the prior art.
Figure 5:
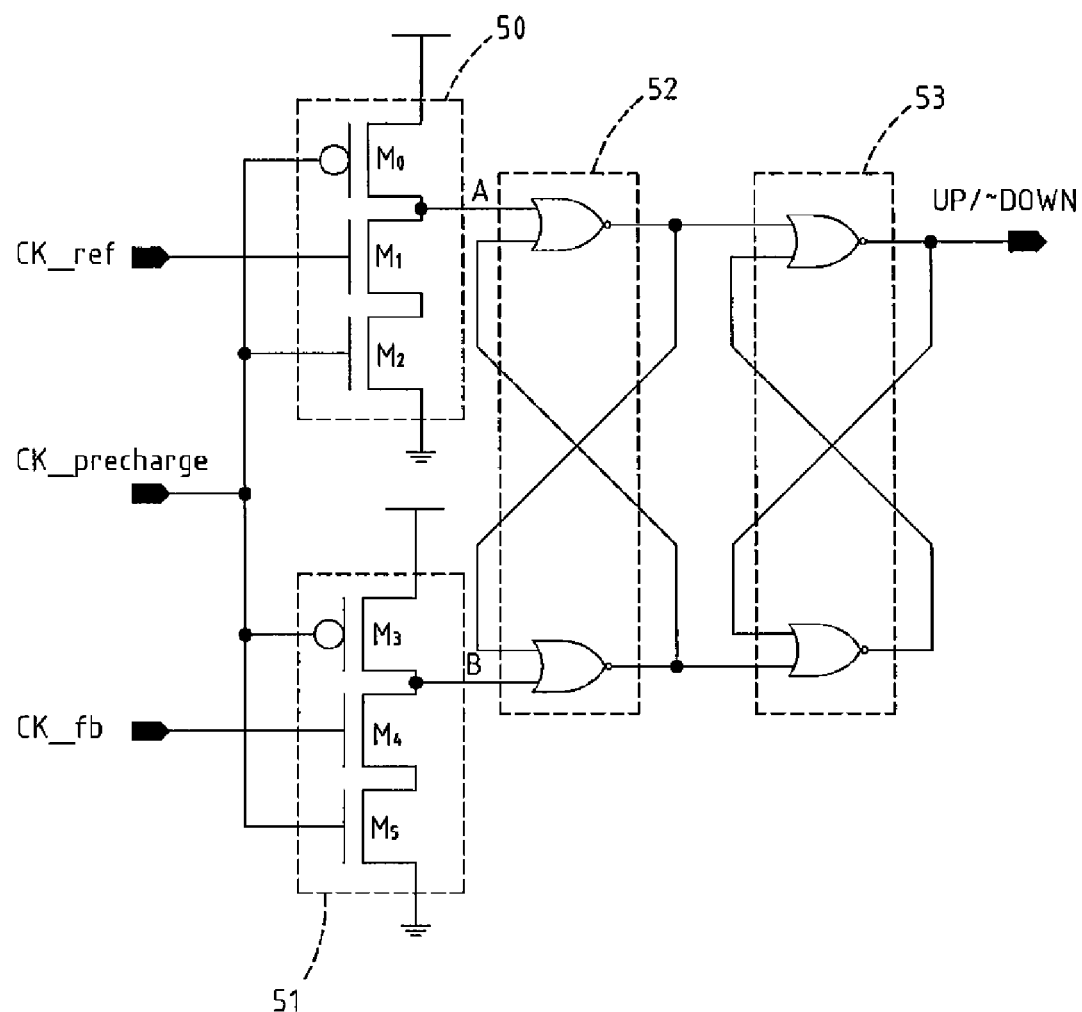
FIG. 5 is a dynamic circuit based phase detector in the prior art.
Figure 6A:
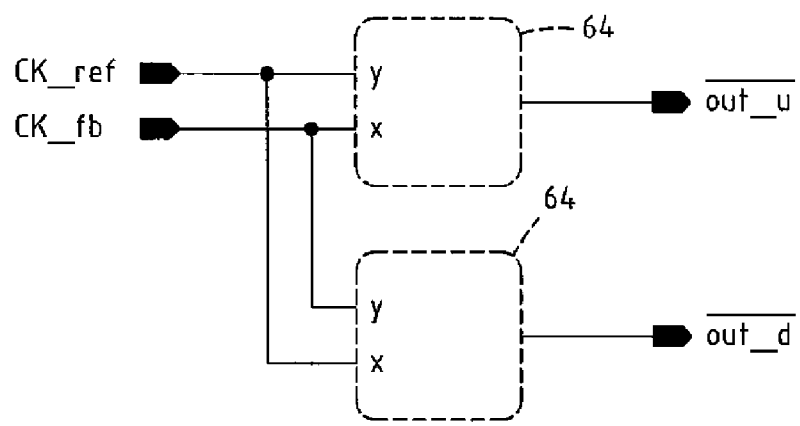
FIG. 6a is a phase detector according to a first embodiment of the present invention.

FIG. 6a is a phase detector according to a first embodiment of the present invention. The phase detector 6 comprises two output-latched half-transparent (OLHT) modules 64 and is used to receive input signals CK_ref and CK_fb.

Figure 6B:
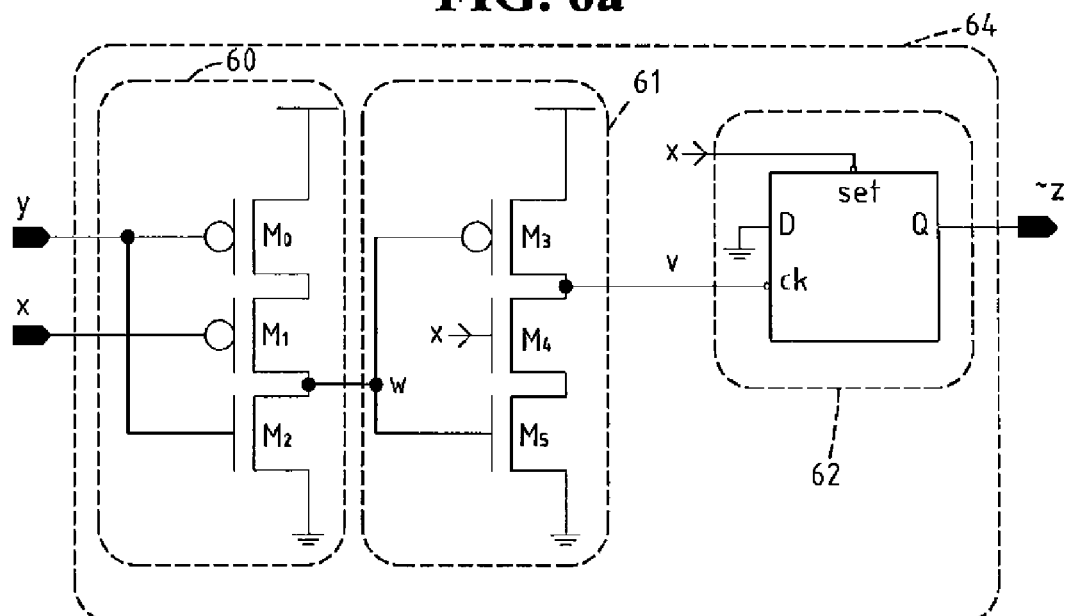
FIG. 6b is a schematic diagram of an output-latched half-transparent (OLHT) module of the phase detector according to the first embodiment of the present invention.

Referring next to FIG. 6b, which is the schematic diagram of the OLHT module of the phase detector shown in FIG. 6a according to the first embodiment of the present invention. In this embodiment, the OLHT module 64 comprises two logic operation units 60, 61 and a latch circuit 62. The logic operation unit 60 comprises two PMOS transistors M0, M1 and an NMOS transistor M2. The PMOS transistor M0 and the NMOS transistor M2 receives a first input signal y, and the PMOS transistor Ml receives a second input signal x. The logic operation unit 61 comprises one PMOS transistor M3 and two NMOS transistor M4, M5. The PMOS transistor M3 and the NMOS transistor M5 receives a first stage output signal w (an output of the logic operation unit 60), while the NMOS transistor M4 receives a second input signal x. The logic operation unit 61 generates a second stage output signal v to the latch circuit 62.

The latch circuit 62 receives the second input signal x and the second stage output signal v and generates a third stage output signal ~z in response thereto.

In a preferred embodiment, the latch circuit 62 may be such as a D-type latch circuit having a set input terminal (set), a data input terminal (D) and a clock input terminal (ck), and is driven by a low level clock signal. The set terminal (set) receives the second input signal x, the data input terminal (D) is directly connected to ground, and the clock input terminal (ck) receives the second stage output signal v from the logic operation unit 61.

Figure 6C:
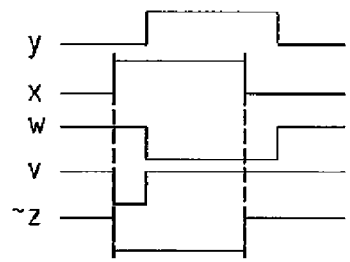
FIG. 6c is a timing plot of two sets of timing of the OLHT module of the phase detector shown in FIG. 6b according to the first embodiment of the present invention.
Figure 6C:
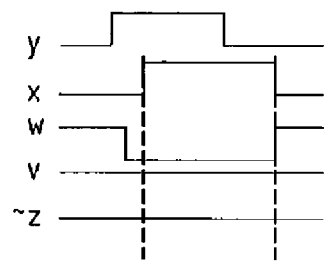

Referring to FIG. 6c, in which two sets of timing, Timing 1 and Timing 2, of the OLHT module as shown in FIG. 6b according to the first embodiment of the present invention are depicted. In Timing 1, the rising edge of the first input signal y has a phase lag with respect to that of the second input signal x. In Timing 2, the rising edge of the first input signal y has a phase lead with respect to that of the second input signal x. Now, Timing 1 is discussed below. When the first input signal y and the second input signal x in the logic operation unit 60 are both low (i.e. y=0 and x=0), the MOS transistors M0 and M1 are both turned on, pulling the first stage output signal w to high. Correspondingly, the MOS transistor M3 is turned off and the MOS transistor M5 is turned on in the logic operation unit 61.

At this time, since the second input signal x is low, the MOS transistor M4 in the logic operation unit 61 is turned off, maintaining the second stage output signal v at the previous state (e.g. high state). Further, the latch circuit 62 is in a set state and the third stage output signal ~z is maintained at high level. When the second input signal x transits to high, the MOS transistor M1 is turned off and the MOS transistor M4 is turned on. Meanwhile, the second stage output signal v is caused to transit from high to low and thus trigger the latch circuit 62, so as to enable the third stage output signal ~z to low. The low level state of the second stage output signal v lasts only until the first input signal y becomes high. This is because when the first input signal y transits to high, the first stage output signal w of the logic operation unit 60 transits to low and thus turns on the MOS transistor M3 and turns off the MOS transistor M5, pulling the second stage output signal v to high.

When the second stage output signal v is pulled high, the output signal ~z of the OLHT module 64 maintains in low level until the second input signal x transits to low again, where an output Q of the latch circuit 62 is set. In summary, when the rising edge of the first input signal y has a phase lag with respect to that of the second input signal x, the output signal ~z of the OLHT module 64 is low when the second input signal x is high.

In a preferred embodiment if the rising edge of the first output signal y has a phase lead with respect to that of the second input signal x as shown in Timing 2 of FIG. 6c, the output signal ~z of the OLHT module 64 maintains high owing to absence of a discharging path.

In conclusion, when the condition is met where the rising edge of the first input signal y has a phase lag with respect to that of the second input signal, the OLHT module 64 generates a low pulse output having a width equal to that of the second input signal x.

In this embodiment the detection for the phase relationship between the first and second input signals y, x requires two identical OLHT modules 64 in the phase detector 6, each having a reverse connection as compared to each other with respect to their input signals, shown in FIG. 6a.

That is, even when the rising edges of the first and second input signals y, x of the OLHT module 64 occur at almost the same time (i.e. only a very small phase difference exists), the period when the output signal ~z is low is still equal to the width of the second input signal x. Thus, the width of the output signal ~z of the OLHT module 64 can exempt the signal ~z itself from being filtered out. Accordingly, the phase detector is suitable to be used in a digital control loop where the phase detector needs to drive a relatively large load.

Figure 7:
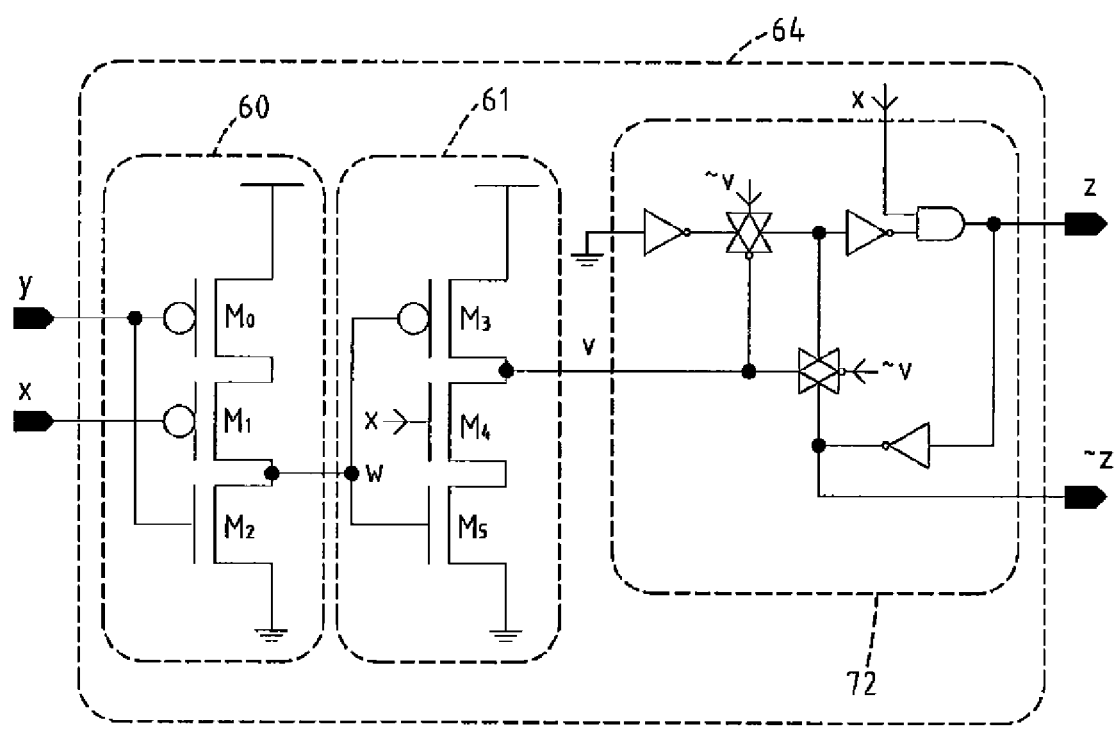
FIG. 7 is a schematic diagram of the OLHT module of the phase detector according to a second embodiment of the present invention.

Referring next to FIG. 7, which shows the schematic diagram of the OLHT module of the phase detector according to a second embodiment of the present invention. In this embodiment, the schematic diagram of a transmission-gate based D-type latch is depicted in replace of the D-type latch symbol shown in FIG. 6. In this embodiment, the latch circuit 72 is composed of a plurality of logic gates.

Referring to FIG. 8a, a schematic diagram of the OLHT module of the phase detector according to a third embodiment of the present invention is depicted therein, in which another dynamic circuit is used as the D-type latch in the OLHT module.

In the OLHT module 64, two logic operation units 80, 81 and a latch circuit 82 are comprised. The logic operation units 80, 81 are identical to the logic operation units 60, 61 shown in FIG. 6b.

The latch circuit 82 comprises a logic operation unit 82a and a latch 82b connected in series.

The logic operation unit 82a comprises one PMOS transistor M6 and two NMOS transistors M7 and M8. The MOS transistors M6 and M8 both receive a second stage output signal v from the logic operation unit 81. The MOS transistor M7 may be controlled by an inverse version ~y or ~x of the first or second input signal y or x. The latch 82b comprises inverters Me and Mf, and a PMOS transistor Mp forms a feedback path.

The inverter Me receives an output signal u of the logic operation unit 82a to generate a third stage output signal ~z according thereto. The inverters Me and Mf are connected in series to generate another third stage output signal z. The feedback MOS transistor Mp receives the output signal ~z.

In a preferred embodiment the inverter Mf of the latch circuit 82 may be omitted and thus the output signal u is directly used as the output signal z.

In FIG. 8a, if the MOS transistor M7 in the logic operation unit 82a is controlled by the input signal ~x, then two sets of timing, Timing 1 and Timing 2, are provided as shown in FIG. 8b. In Timing 1, the rising edge of the first input signal y has a phase lag with respect to that of the second input signal x. In Timing 2, the rising edge of the first input signal y has a phase lead with respect to that of the second input signal x.

Take Timing 1 as an example. In the logic operation unit 80, when the first and second input signals y and x are low at the same time (i.e. y=0 and x=0), the MOS transistors M0 and M1 turns on, pulling the first stage output signal w to high and correspondingly turning off the MOS transistor M3 and turning on the MOS transistor M5 of the logic operation unit 81. At this time, since the second input signal x is low, the MOS transistor M4 is turned off, maintaining the second stage output signal v at a previous state (assumed here as a high state). Meanwhile, the MOS transistor M8 in the logic operation unit 82a is turned on since the second stage output signal v of the logic operation unit 81 is in high level. In addition, the MOS transistor M7 is turned on since the input signal ~x high at that time, pulling the output signal u low. The, the low-level output signal u is sent to the latch 82b and the latch 82b generates a high level output signal ~z and a low level output signal z according to the output signal u.

When the second input signal x begins to transit to high, the MOS transistor M1 in the logic operation unit 80 and the MOS transistor M4 in the logic operation unit 81 are turned off and on, respectively, pulling the second stage output signal v to low and turning on and off the MOS transistors M6 and M8, respectively.

When the transition of the second input signal x occurs, the MOS transistor M7 in the logic operation unit 82a is at the same time turned off and the output signal u of the logic operation unit 82a transits to high. Correspondingly, the transition of the output signal u causes the latch 82b to generate a low level output signal ~z and a high level output signal z.

At this time, the MOS transistor Mp is also turned on due to the output signal ~z to assist in maintenance of the high level state of the output signal u. The second stage output signal v only maintains its low level state until the first input signal y transits to high. This is because when the first input signal y transits to high, the first stage output signal w of the logic operation unit 80 is caused to transit to low, further causing the MOS transistors M3 and M5 in the logic operation unit 81 turned on and off, respectively. At this time, the second stage output signal v is pulled high. As a result, the output signals u, ~z and z are all maintained in the previous state due to the MOS transistor Mp until the input signal ~x transits to high again.

In summary, when the rising edge of the first input signal y has a phase lag with respect to that of the second input signal x, the pulse width when the third stage output signal ~z (z) staying low (high) is equal to the duration when the second input signal ~x (x) is high (low).

In the same sense, if the rising edge of the first input signal y in Timing 2 in FIG. 8b has a phase lead with respect to that of the second input signal x, the third stage output signal ~z (z) of the OLHT module 64 maintains high (low) due to absence of a discharging path.

In this embodiment, the dynamic logic operation unit 82a in the OLHT module 64 is allowed to be selectively controlled by the input signal ~x or ~y. FIG. 8c is a timing plot of two sets of timing occurring when a MOS transistor M7 is controlled by an output signal ~y in the OLHT module of the phase detector according to the third embodiment of the present invention. In this case, the output signal u is caused to have a delay of its state changing. Accordingly, the time that the output signal ~z (z) maintains low (high) is longer than the time when the signal ~z (z) itself is controlled by the input signal ~x. Therefore, the OLHT module 64 is also suitable to be used in a digital control loop.

In conclusion, when the condition is met where the first input signal y has its rising edge lagging that of the second input signal x, the OLHT module 64 will generate a low (high) pulse output ~z (z) having a pulse width equal to a phase difference of the rising edge of the input signal x and the falling edge of the input signal y.

To detect the phase relationship of the input signals x and y, two identical OLHT modules 64 of this kind are required to form the phase detector 6, shown in FIG. 6a, where input signals y and x for an upper and lower ones of the two identical modules 64 are reversely connected as compared to each other.

Figure 9A:
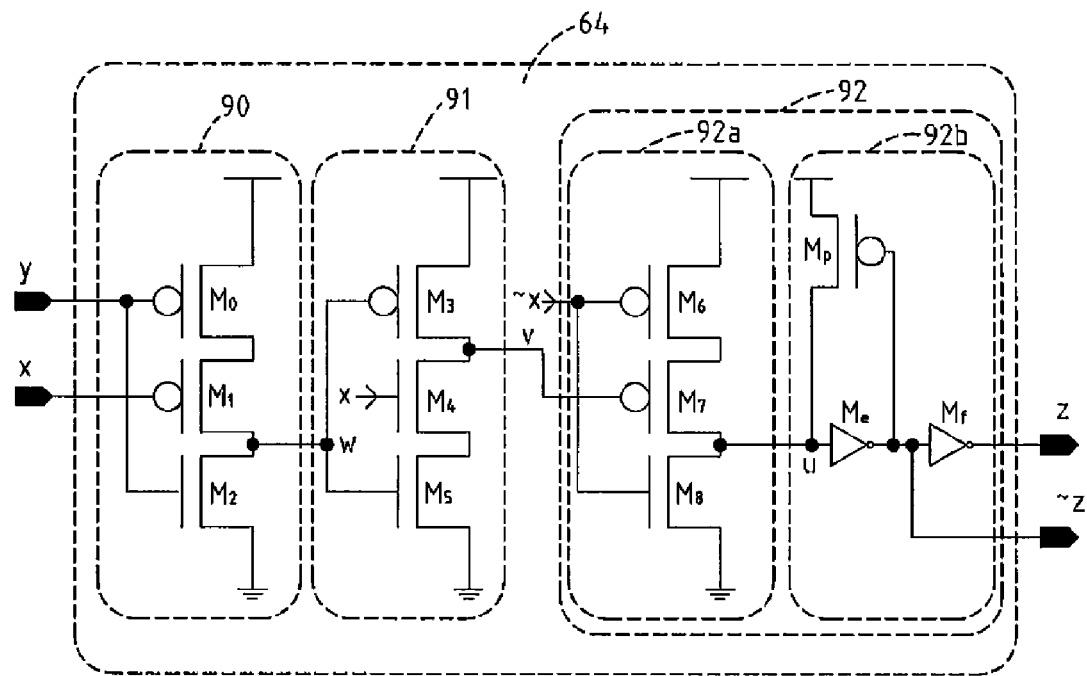
FIG. 9a is a schematic diagram of the OLHT module of the phase detector according to a fourth embodiment of the present invention.

FIG. 9a is a schematic diagram of the OLHT module of the phase detector according to a fourth embodiment of the present invention. The OLHT module 64 herein is composed of two logic operation units 90, 91 and a latch circuit 92 connected in series. The logic operation units 90 and 91 are identical to the logic operation units 60, 61 shown in FIG. 6b.

The latch circuit 92 is a circuit comprising a dynamic circuit. The latch circuit 92 comprises a logic operation unit 92a and a latch 92b connected in series. The logic operation unit 92a is composed of two PMOS transistors M6 and M7 and one NMOS transistor M8. The MOS transistors M6 and M8 both receive an input signal ~x, and the MOS transistor M7 is controlled by a second stage output signal v of the logic operation unit 91. The latch 92b comprises inverters Me and Mf and a feedback PMOS transistor Mp. The inverter Me receives an output signal u of the logic operation unit 92a to generate a third stage output signal ~z according thereto. The inverters Me and Mf are connected in series to generate another output signal z. The feedback MOS transistor Mp receives the output signal ~z.

In a preferred embodiment, the inverter Mf of the latch circuit 92 may be omitted and thus the output signal u is directly used as the output signal z.

Figure 9B:
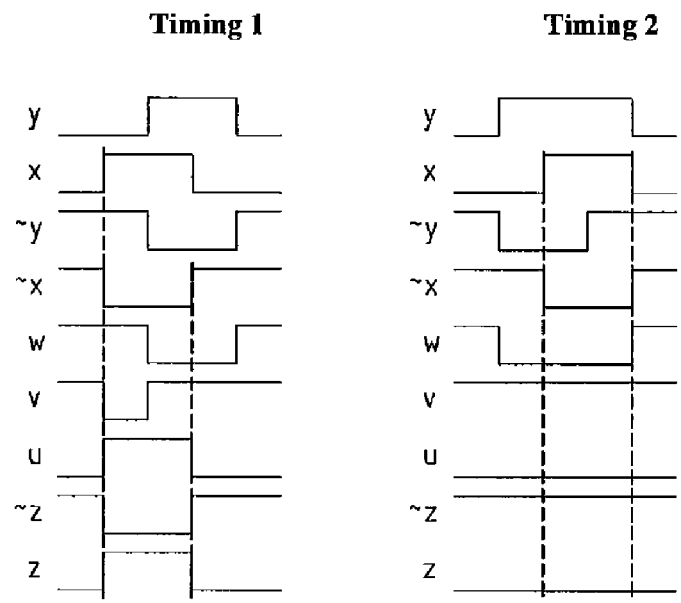
FIG. 9b is a timing plot of two sets of timing of the OLHT module of the phase detector according to a fourth embodiment of the present invention.

FIG. 9b, two sets of timing, Timing 1 and Timing 2, occurring on the OLHT module shown in FIG. 9a are shown therein. In Timing 1, the rising edge of the first input signal y has a phase lag with respect to that of the second input signal x. In Timing 2, the first input signal y has a phase lead with respect to the second input signal x.

Take Timing 1 as an example. In the logic operation unit 90, when the first and second input signals y and x are both low at the same time (i.e. y=0 and x=0), the MOS transistors M0 and M1 turn on, pulling the first stage output signal w to high and correspondingly turning off the MOS transistor M3 and turning on the MOS transistor M5 of the logic operation unit 91. At this time, since the second input signal x is low, the MOS transistor M4 is turned off, maintaining the second stage output signal v in a previous state (assumed here as a high state). Meanwhile, the MOS transistor M7 is turned off since the second stage output signal v is high and the MOS transistor M8 in the same unit 92a is turned on due to the high level input signal ~x. At this time, the output signal u is low, which is then sent to the latch 92b to generate a high level output signal ~z and a low level output signal z according to the output signal u. 10082 When the second input signal x begins to transit to high, the MOS transistor M1 in the logic operation unit 90 is turned off and the MOS transistor M4 in the logic operation unit 91 is turned on, pulling the second stage output signal v to low and turning on the MOS transistors M6 and M7 in the logic operation unit 92a.

When the transition of the second input signal x occurs, the MOS transistor M8 in the logic operation unit 92a is at the same time turned off and the output signal u of the logic operation unit 92a is caused to transit to high. Correspondingly, the transition of the output signal u causes the latch 92b to generate a low level output signal ~z and a high level output signal z.

At this time, the MOS transistor Mp is also turned on due to the low output signal ~z to assist in maintenance of the high level state of the output signal u. The second stage output signal v only maintains its low level state until the first input signal y transits to high. This is because when the first input signal y transits to high, the first stage output signal w of the logic operation unit 90 is caused to transit to low, further causing the MOS transistors M3 and M5 in the logic operation unit 91 turned on and off, respectively. At this time, the second stage output signal v is pulled high. When the second stage output signal v is pulled high, the MOS transistor M7 of the logic operation unit 92a is turned off under the control of the second stage output signal v, and the MOS transistor M8 maintains the off state since the input signal ~x is low. As a result, the output signals u, ~z and z are all maintained in the previous state due to the MOS transistor Mp until the input signal ~x transits to high again.

In summary, when the rising edge of the first input signal y has a phase lag with respect to that of the second input signal x, the output signal ~z (z) is low (high) at the time when the input signal x (~x) is high (low).

In conclusion, the phase detector of this invention has the following advantages. (1) The OLHT module 64 can generate a much longer pulse output, and the longer pulse can prevent from being filtered out. (2) The phase detector 6 achieves the purpose of changing the output signal ~z by controlling the timing for charging of the output of the latch circuit 62. Since the latch circuit 62 of the phase detector 6 is used only for latching the logic level, it does not affect the characteristics of the high speed and high resolution features of the dynamic circuits 60, 61. That is, the phase detector 6 can retain the advantages of high speed and high resolution of the dynamic circuits 60, 61.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A phase detector, comprising:
   a first output-latch half-transparent (OLHT) module having a first input terminal receiving a first input signal and a second input terminal receiving a second input signal; and
   a second OLHT module having a first input terminal receiving the second input signal and a second input terminal receiving the first input signal;
   wherein each of the first and the second OLHT modules comprises:
      a first logic operation unit receiving the first and the second input signals and outputting a first stage output signal in response thereto;
      a second logic operation unit electrically coupled to the first logic operation unit and receiving the second input signal and the first stage output signal and outputting a second stage output signal in response to the first stage output signal and the second input signal; and
      a latch circuit electrically connected to the second logic operation unit and receiving the second input signal, the second stage output signal and a logic low signal to latch a third stage output signal.

2. The phase detector as claimed in claim 1, wherein the latch circuit has a data input terminal receiving the logic low signal, a clock input terminal receiving the second stage output signal and a set input terminal receiving the second input signal.

3. The phase detector as claimed in claim 1, wherein the first logic operation unit comprises a plurality of P-type transistors and an N-type transistor.

4. The phase detector as claimed in claim 1, wherein the second logic operation unit comprises a plurality of N-type transistors and a P-type transistor.

5. The phase detector as claimed in claim 1, wherein the latch circuit is a D-type latch circuit.

6. The phase detector as claimed in claim 1, wherein the latch circuit comprises:

a third logic operation unit electrically coupled to the second logic operation unit and receiving the second stage output signal and an inverse version of the second input signal and outputting an output signal in response thereto; and
   an inverter electrically coupled to the third logic operation unit and receiving the output signal and outputting the third stage output signal in response thereto.

7. The phase detector as claimed in claim 6, wherein the latch circuit further comprises a feedback transistor electrically coupled to the inverter and being enabled according to the third stage output signal.

8. The phase detector as claimed in claim 6, wherein the third logic operation unit comprises a plurality of P-type transistors and an N-type transistor.

9. The phase detector as claimed in claim 6, wherein the third logic operation unit comprises a plurality of N-type transistors and a P-type transistor.

10. The phase detector as claimed in claim 1, wherein the first stage output signal transits from high to low when the first input signal transits from low to high.

11. The phase detector as claimed in claim 10, wherein the second stage output signal is pulled high when the first output signal transits from high to low.

12. The phase detector as claimed in claim 11, wherein the third stage output signal is latched to low until the second input signal transits to low when the second stage output signal is pulled high.

13. The phase detector as claimed in claim 1, wherein the second stage output signal transits from high to low when the second input signal transits from low to high.

14. The phase detector as claimed in claim 13, wherein the third stage output signal is latched to low when the second stage output signal transits from high to low.

15. The phase detector as claimed in claim 14, wherein the second stage output signal is low only until the first input signal transits to high.

16. The phase detector as claimed in claim 15, wherein the first stage output signal transits to low and the second stage output signal is then pulled high when the first input signal transits to high.

* * * * *